United States Patent
Booman et al.

(10) Patent No.: US 10,330,700 B2
(45) Date of Patent: Jun. 25, 2019

(54) SIGNAL ACQUISITION PROBE STORING COMPRESSED OR COMPRESSED AND FILTERED TIME DOMAIN IMPULSE OR STEP RESPONSE DATA FOR USE IN A SIGNAL MEASUREMENT SYSTEM

(71) Applicant: Tektronix, Inc., Beaverton, OR (US)

(72) Inventors: Richard A. Booman, Lake Oswego, OR (US); John J. Pickerd, Hillsboro, OR (US)

(73) Assignee: Tektronix, Inc., Beaverton, OR (US)

(*) Notice: Subject to any disclaimer, the term of this patent is extended or adjusted under 35 U.S.C. 154(b) by 571 days.

(21) Appl. No.: 14/828,790

(22) Filed: Aug. 18, 2015

(65) Prior Publication Data
US 2016/0047842 A1 Feb. 18, 2016

Related U.S. Application Data

(62) Division of application No. 12/896,426, filed on Oct. 1, 2010, now Pat. No. 9,140,723.

(51) Int. Cl.
*G01R 25/00* (2006.01)
*G01R 1/067* (2006.01)

(52) U.S. Cl.
CPC ................ *G01R 1/06766* (2013.01)

(58) Field of Classification Search
CPC ................................... G01R 1/06766
USPC .......................................... 702/79
See application file for complete search history.

(56) References Cited

U.S. PATENT DOCUMENTS

| | | | |
|---|---|---|---|
| 4,359,608 A * | 11/1982 | Watson | H04B 1/66 704/201 |
| 5,631,562 A | 5/1997 | Cram et al. | |
| 6,232,764 B1 | 5/2001 | Rettig et al. | |
| 6,725,170 B1 * | 4/2004 | Hickman | G01R 1/06788 324/72.5 |
| 6,801,042 B2 | 10/2004 | McPherson et al. | |
| 9,110,121 B2 * | 8/2015 | Motz | G01R 33/075 |
| 2007/0266275 A1 * | 11/2007 | Stimple | H03L 7/0807 714/700 |
| 2008/0120052 A1 | 5/2008 | Ridder et al. | |
| 2008/0242962 A1 * | 10/2008 | Roesicke | A61B 5/14532 600/347 |
| 2008/0281893 A1 | 11/2008 | Rao | |

OTHER PUBLICATIONS

Rao et al., "The Need for Impulse Response Models and an Accurate Method for Impulse Generation from Band-Limited S-Parameters;" DesignCon 2008.

* cited by examiner

*Primary Examiner* — Toan M Le
*Assistant Examiner* — Xiuqin Sun
(74) *Attorney, Agent, or Firm* — Miller Nash Graham & Dunn; Andrew J. Harrington

(57) ABSTRACT

A signal acquisition probe stores compressed or compressed and filtered time domain data samples representing at least one of an impulse response or step response characterizing the signal acquisition probe. The compressed or compressed and filtered time domain data samples of the impulse response or the step response are provided to a signal measurement instrument for compensating the signal measurement instrument for the impulse or step response of the signal measurement instrument.

4 Claims, 13 Drawing Sheets

SIGNAL ACQUISITION PROBE STORING COMPRESSED OR COMPRESSED AND FILTERED TIME DOMAIN IMPULSE OR STEP RESPONSE DATA FOR USE IN A SIGNAL MEASUREMENT SYSTEM

The present invention related generally to signal acquisition probes and more particularly to a signal acquisition probe storing compressed or compressed and filtered time domain data samples of an impulse response or a step response characterizing the voltage through response of the signal acquisition probe.

Signal acquisition probes are designed to measure electrical signal from DC to greater than 20 GHz. They are also designed to meet specific requirements of a user, such as measuring voltage or current signals. Voltage probes are divided into passive voltage probes, active voltage probes, differential voltage probes, high voltage probes and low capacitance probes. Each type of probe has a specified bandwidth that is used with a signal measurement instrument, such as an oscilloscope, logic analyzer and the like, having a sufficiently wide bandwidth to allow accurate measurements of electrical signals from a device under test.

The frequency bandwidths of a signal acquisition probe and a signal measurement instrument are specified as above the 3 dB down point of the frequency magnitude. Generally, the combination of the probe and oscilloscope in a measurement system results in the system bandwidth being lower than the bandwidths of the individual probe and oscilloscope. Various techniques have been used to peak the overall bandwidth of the oscilloscope and probe system.

U.S. Pat. No. 6,725,170 describes a smart probe that is used with an oscilloscope for automatic self-adjustment of the oscilloscope's bandwidth. The probe contains a memory in which is stored S-parameters that characterize the probe's frequency response. When the probe is connected to the oscilloscope, the S-parameters of the probe are read into the oscilloscope. The oscilloscope has a controller that is operable under program control for automatically adjusting the scope's frequency response to compensate for the probe's characteristic frequency response, whereby the scope and probe when connected are characterized by a predefined overall system frequency response.

The amount of memory required to store the S-parameters characteristics of the measurement probe increases as a function of the bandwidths probe. This results in increased costs and size of the probe. What is needed is a way of storing the response characteristics of measurement probe without substantially increasing the cost or size of the probe.

SUMMARY OF THE INVENTION

Accordingly, the present invention is to a signal acquisition probe having a memory therein for storing compressed or compressed and filtered time domain data samples representative of an impulse response or a step response characterizing the signal acquisition probe. The signal acquisition probe includes a housing having a probing tip extending from one end of the housing and an electrically conductive cable extending from the other end of the housing. Electrical circuitry is disposed within the housing and coupled to the probing tip and the electrically conductive cable. The memory stores time domain data samples of a through impulse response or a through step response.

The memory may also store sets of compressed or compressed and filtered time domain data samples of impulse responses of the signal acquisition probe wherein the sets includes at least two of a forward through impulse response, reverse through impulse response, input reflection voltage impulse response and output reflection voltage impulse response. Likewise, the memory may store sets of compressed or compressed and filtered time domain data samples of step responses of the signal acquisition probe wherein the sets includes at least two of a forward through step response, reverse through step response, input reflection voltage step response and output reflection voltage step response. The compressed or compressed and filtered time domain data samples of at least one of the impulse responses and step responses may be derived from at least one of S-parameters, T-parameters, and ABCD-parameters representing a frequency response of the signal acquisition probe.

The electrical response of a signal acquisition probe may be characterized by applying a calibration signal to the signal acquisition probe and acquiring time domains data samples of the calibration signal characterizing the response of the signal acquisition probe. A compressed time domain data sample record is generated from the time domain data samples of the characterizing response of the probe. The compressed time domain data sample record of the characterizing response is stored in a memory associated with the signal acquisition probe. The calibrating signal may be a rising edge step signal or an impulse signal. The acquired time domain data samples of the rising edge step signal represent a characterizing step response of the probe. The derivative of the time domain data samples representing the characterizing step response of the probe may be taken to generate time domain data samples representing an impulse response of the probe.

The acquired time domain data samples characterizing the response of the signal acquisition probe may be compressed as a function of a value representing the rate of change of magnitude values of the time domain data samples exceeding a threshold value. The acquired time domain data samples characterizing the response of the signal acquisition probe may also be compressed as a function of comparing magnitude values of the time domain data samples to at least one of a maximum threshold value and minimum threshold value. The acquired time domain data samples characterizing the response of the probe may also be filtered.

The filtering of the acquired time domain data samples representing the characterizing response of the signal acquisition probe includes generating an averaged time domain data sample value over a time domain data sample range from an initial time domain data sample to a subsequent time domain data sample from the time domain data sample record when the rate of change value exceeds the threshold value. Additional averaged time domain data sample values are generated over additional time domain data sample ranges where the subsequent time domain data sample from the preceding time domain data sample range becomes the initial time domain data sample for the next time domain data sample range. The averaged time domain data samples from the time domain data sample ranges are stored as a filtered and compressed time domain data sample record representing the characterizing response of the signal acquisition probe in the memory associated with the signal acquisition probe.

A further method of filtering of the time domain data sample record representing the characterizing response of the signal acquisition probe includes generating an averaged time domain data sample value over a time domain data sample range defined by an initial time domain data sample and a subsequent time domain data sample exceeding at least one of a maximum threshold value and a minimum threshold value centered on the initial time domain data sample. Additional averaged time domain data sample values are generated over additional time domain data sample ranges where the subsequent time domain data sample from the preceding time domain data sample range becomes the initial time domain data sample for the next time domain data sample range. The averaged time domain data samples from the time domain data sample ranges are stored as filtered and compressed time domain data sample record representing the characterizing response of the signal acquisition probe in the memory associated with the signal acquisition probe.

One method of generating time domain data samples representative of an impulse response or a step response of the signal acquisition probe is to acquire at least one of S-parameter reflection coefficients and transmission coefficients characterizing the spectral response of the signal acquisition probe. The S-parameter reflection or transmission coefficient is converted to time domain data samples representing an impulse response. The time domain sample data are compressed as a function of the rate of change of the impulse response and stored in memory of the signal acquisition probe.

Additional steps may include acquiring the S-parameter reflection coefficients and transmission coefficients characterizing the spectral response of the signal acquisition probe and converting each of the S-parameter reflection coefficients and the transmission coefficients to time domain data samples representing corresponding impulse responses. The time domain data samples of the each of the impulse responses are compressed as a function of the rate of change of the respective impulse responses. The compressed time domain data samples of the respective impulse responses are stored in memory of the signal acquisition probe.

Each of the impulse responses representing one of the S-parameter transmission coefficient and reflection coefficients may be converted to time domain data samples of corresponding step responses. The time domain data samples of the each of the step responses are compressed as a function of the rate of change of the respective step responses. The compressed time domain data samples of the respective step responses are stored in memory of the signal acquisition probe.

The objects, advantages and novel features of the present invention are apparent from the following detailed description when read in conjunction with appended claims and attached drawings.

BRIEF DESCRIPTION OF THE DRAWING FIGURES

DETAILED DESCRIPTION OF THE INVENTION

Figure 1:
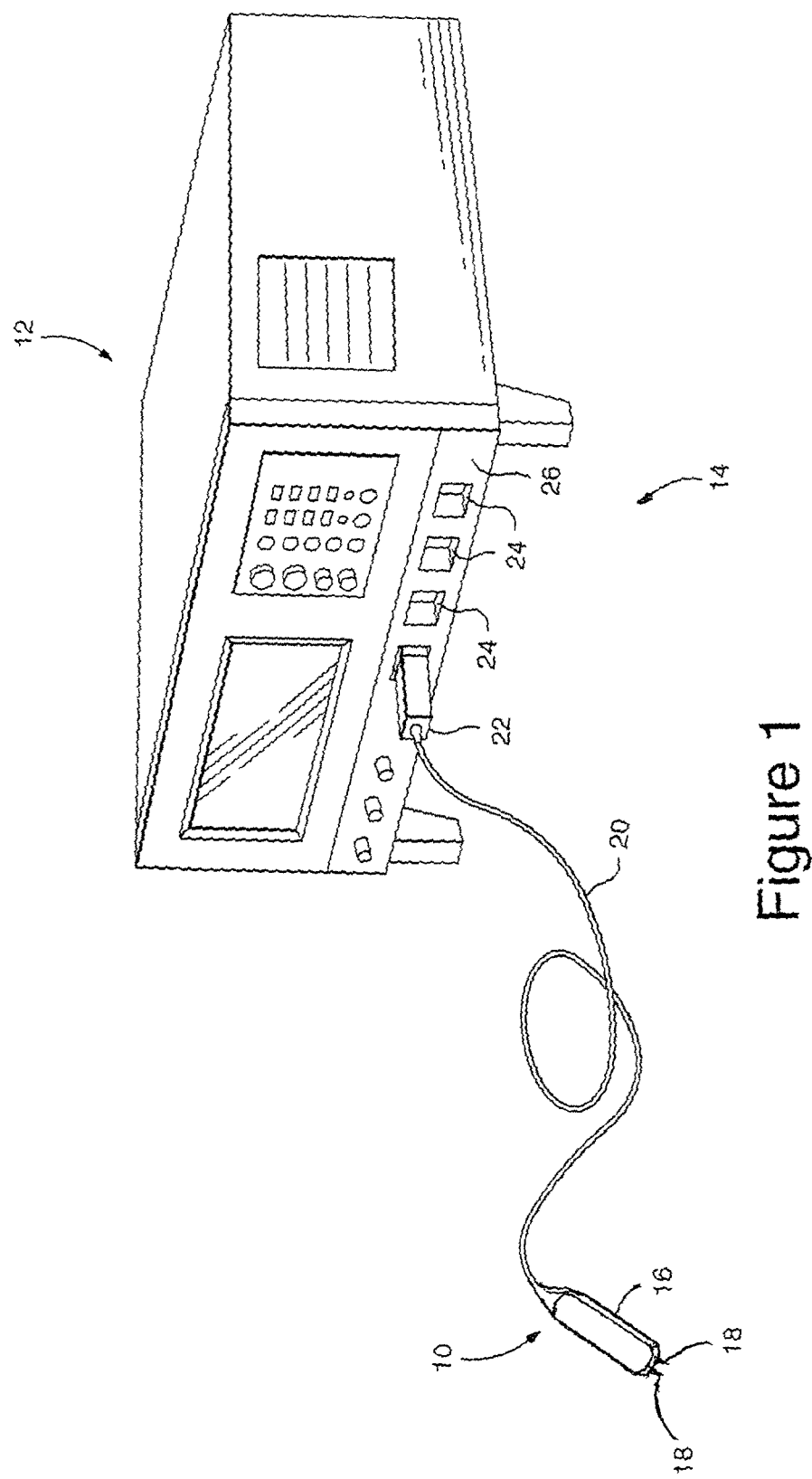
FIG. 1 is a perspective view of a signal measurement system having a signal acquisition probe storing compressed time domain impulse or step response data samples according to the present invention.

FIG. 1 illustrates a signal acquisition probe 10 connected to a signal measurement instrument 12, such as a digital oscilloscope, logic analyzer or the like, forming a signal measurement system 14 for testing a circuit or device under test. The signal acquisition probe 10 includes a housing 16, in the form of a probe head, with probing tips 18 extending from one end of the housing 16 and a signal cable 20 extending from the other end. The probing tips 18 may be signal and ground probing tips or differential probing tips. The housing may also include a single probing tip for coupling a signal under test to the probe. The housing 16 includes electrical circuitry for conditioning an electrical signal from a device under test. The signal cable 20 is coupled to a probe interconnect housing 22. The probe interconnect housing 22 has additional electronic circuitry, such as amplifiers, attenuators, filters, memory and the like, that may be controlled by a controller within the probe 10. The controller receives commands from the oscilloscope 12 that are interpreted by the controller for setting variable parameters in the probe, such as gain, attenuation, offset voltage and the like. The signal cable 20 preferably includes a single coaxial wire having a central signal conductor and a surrounding ground or shield conductor. The cable 20 further includes power lines that provide the appropriate voltages to the electronic circuitry in the probe head. The cable 20 may also include one or more command lines that provide command signals from the controller to the electrical circuitry in the probe head. The probe interconnect housing 22 is removably connected to one of several interconnect receptacles 24 on the front panel 26 of the signal measurement instrument 12. The interconnect receptacles 24 have electrical interconnects for coupling the signal under test to signal channels in the signal measurement instrument 12, coupling voltages from the signal measurement instrument 12 to the signal acquisition probe 10, and coupling commands and data to and from the signal acquisition probe 10 and signal measurement instrument 12.

Figure 2:
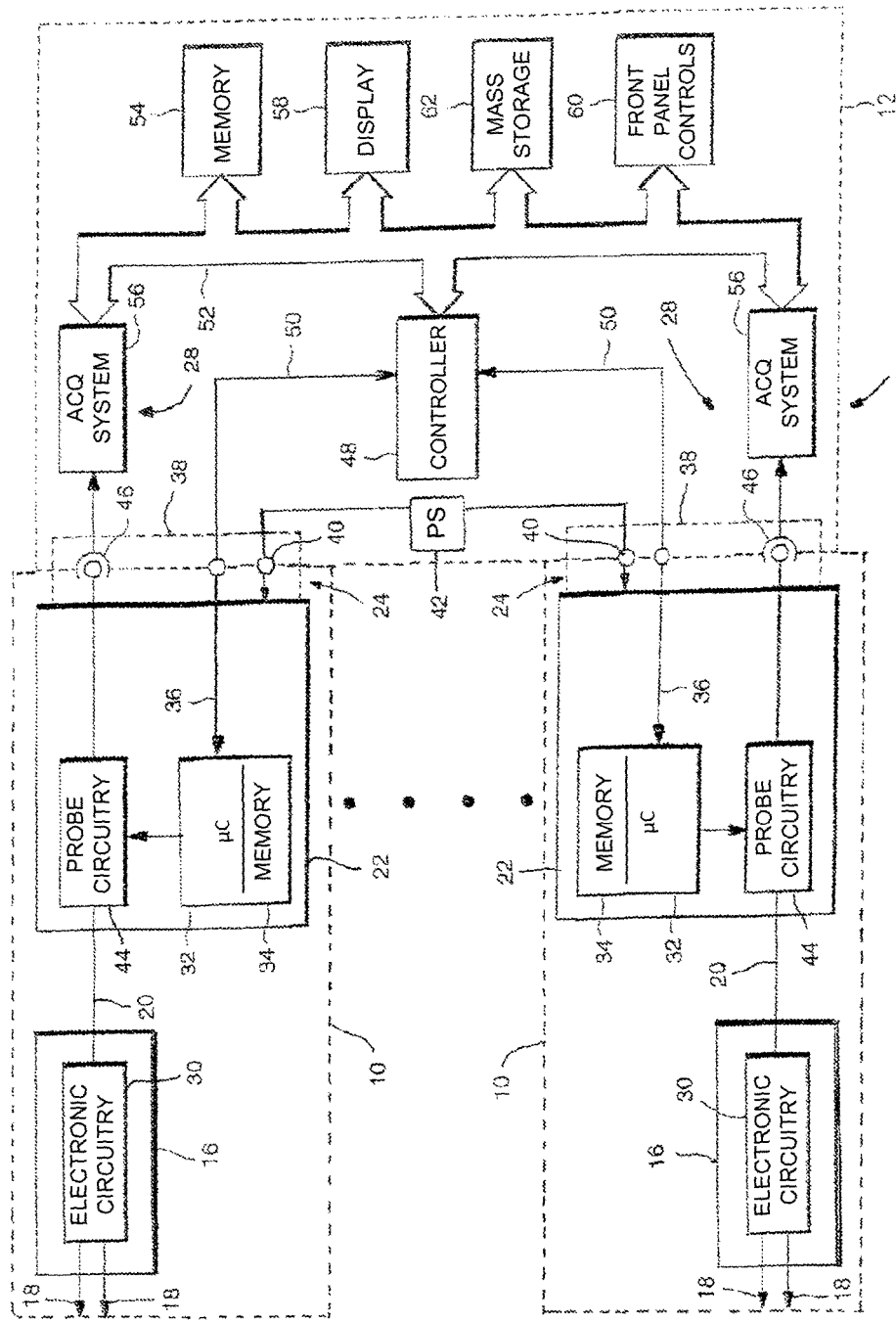
FIG. 2 is a block diagram of a signal measurement system having a signal acquisition probe storing compressed time domain impulse or step response data samples according to the present invention.

Referring to FIG. 2, there is shown a representative block diagram of the signal measurement system 14 having signal acquisition probes 10 containing compressed time domain impulse or step response data samples according to the present invention. Like elements from FIG. 1 are labeled the same in FIG. 2. The signal measurement system 14 includes the signal measurement instrument 12 which for the purposes of describing the invention is a digital oscilloscope. The digital oscilloscope 12 has multiple interconnect receptacles 24 disposed therein for receiving interconnect housings 22 of one or more signal acquisition probes 10 as representatively shown in FIG. 2. Each of the interconnect receptacles 24 is coupled to a signal channel 28 in the signal measurement instrument 12. The signal acquisition probe 10 has a probe head in the form of the housing 16 with at least one probing tip 18 extending from one end. The housing includes electrical circuitry 30, such as attenuation circuitry, amplification circuitry and the like, that is coupled to receive a signal under test via the probing tips 18. The output of the electrical circuitry 30 is coupled via the signal cable 20 to the probe interconnect housing 22.

The probe interconnect housing 22 includes a probe controller 32 which may include an embedded memory 34 or a separate memory device coupled to the controller 32. The probe controller 32 has a communications bus 36, such as an I²C bus, IEEE 1494 bus, USB bus or the like, that provides bi-directional communications with the signal measurement instrument 12. Preferably the communications bus includes a clock line and a data line coupled to a probe interconnect housing interface 38. The output of the signal cable 20 is coupled to probe circuitry 44, such as amplifiers, attenuators, filters, offset circuitry, and the like. The probe circuitry 44 operates on the signal under test to condition the signal under test for processing by the digital oscilloscope 12. Generally, the probe circuitry 44 is controlled by the probe controller 32. The output of the probe circuitry 44 is coupled to the digital oscilloscope 12 via a signal interconnect 46, such as a blind mate connector, BNC connector or the like, in the probe interconnect housing interface 38. The probe interconnect housing interface 38 also includes a voltage power interconnect 40 for providing voltage power to the signal acquisition probe 10 from a power supply 42 in the digital oscilloscope 12.

The digital oscilloscope 12 has a controller 48 that is coupled to a communications bus 50 that is coupled to the probe interconnect housing interface 38. The communications bus 50 provides bi-directional communications with the signal acquisition probe 10 and may take the form of an I²C bus, IEEE 1494 bus, USB bus or the like. Preferably the communications bus 50 includes a clock line and a data line coupled to the probe interconnect housing interface 38.

The digital oscilloscope controller 48 is coupled via a system bus 52 to memory 54. The memory 54 represents both RAM, ROM and cache memory with the RAM memory storing volatile data, such as digital data samples of an input signal generated by an acquisition system 56 coupled to receive the acquired signal from the signal acquisition probe 10. Each acquisition system 56 is associated with one of the signal channels 28 of the signal measurement instrument. The system bus 52 is also connected to the display device 58, such as a liquid crystal display, cathode ray tube or the like, and to front panel controls 60 which may include control entry devices, such as a keyboard and/or mouse as well as the knobs and buttons. A mass storage unit or units 62, such as a hard disk drive, CD ROM drive, tape drive, floppy drive or the like that reads from and/or writes to appropriate mass storage media, may also be connected to the system bus 52. Program instructions for controlling the digital oscilloscope 12 may be stored and accessed from the ROM memory 54 or from the mass storage media of the mass storage unit 62. The controller 48 in the above described digital oscilloscope 12 may also be implemented using multiple controllers and digital signal processing devices. For example, a second controller, such as a Power PC microprocessor manufactured and sold by Motorola, Inc., Schaumburg, Ill., may be included to control the acquisition and processing of the acquired signal. The display device 58 may be controlled by a display controller receiving display instructions from a digital oscilloscope controller 48 and receiving display data from a digital signal processing device. A bus controller may also be included to monitor the probe interconnect housing interface 38 for connected signal acquisition probes 10, and provide communications between the probe interconnect housing interface 38 and the controller 48.

Figure 3:
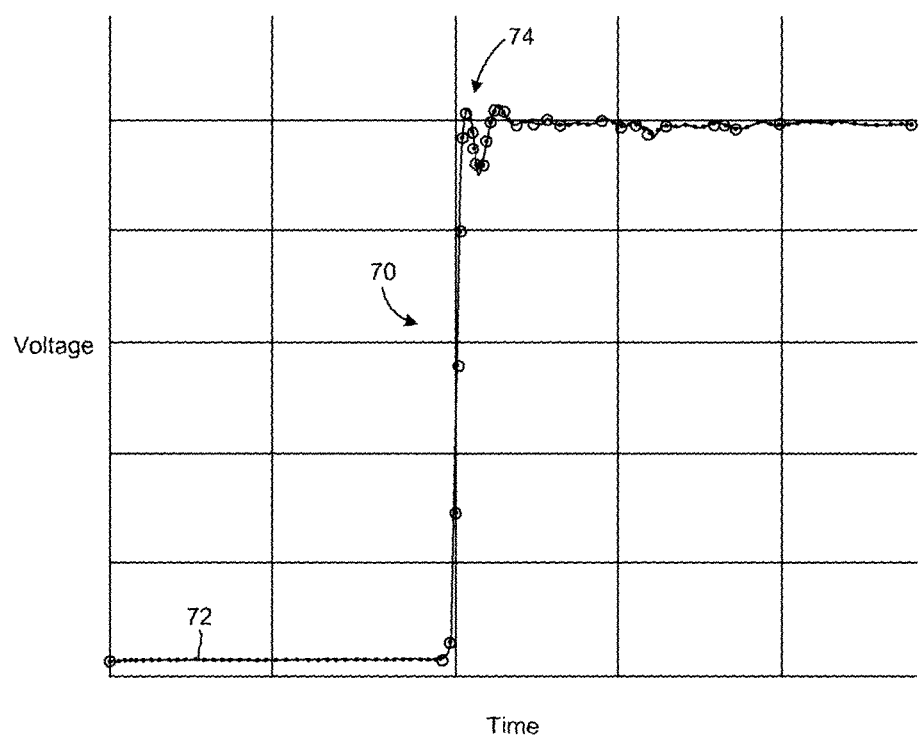
FIG. 3 is a graphical representation of a step response characterizing a signal acquisition probe for illustrating the use of the rate of change in voltage samples for compressing time domain voltage samples in a time domain step response waveform record.

Referring to FIG. 3, there is shown a graphical representation of a step response 70 characterizing a signal acquisition probe 10. A fast rising step voltage is applied to the probing tip 18 of the signal acquisition probe 10 and the output of the probe 10 is acquired by a sampling instrument, such as a sampling oscilloscope. The sampling oscilloscope captures voltage samples at discrete time locations, as shown by the dots 72 on the step response 70, covering the fast rising step voltage. High resolution sampling is used to acquire the voltage samples so that aberrations 74 in the step response 70, such as roll off, overshoot, ringing and the like, can be characterized. The time domain voltage samples over time are stored as time domain data samples in a step response waveform record.

Figure 4:
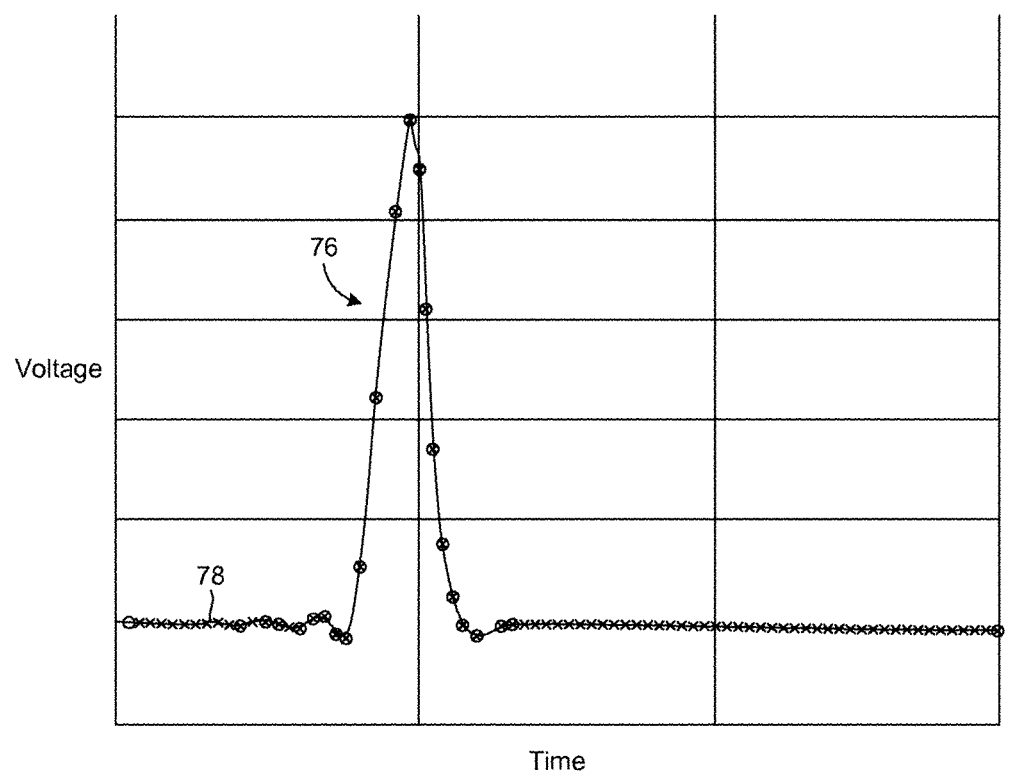
FIG. 4 is a graphical representation of an impulse response characterizing a signal acquisition probe for illustrating the use of the rate of change in voltage samples for compressing time domain voltage samples in a time domain impulse response waveform record.

FIG. 4 shows a graphical representation of an impulse response 76 characterizing a signal acquisition probe 10. An electrical impulse may be generated using an optical source generating a narrow optical impulse, on the order of femtoseconds, that is converted to an electrical signal by a photodiode. The electrical impulse is applied to the probing tip 18 of the signal acquisition probe 10 and the output of the probe 10 is acquired by a sampling instrument, such as a sampling oscilloscope. The sampling oscilloscope captures voltage samples at discrete time locations, as shown by the X's 78 on the impulse response 76. High resolution sampling is used to acquire the voltage samples so that aberrations in the impulse response 76 can be characterized. The voltage samples over time are stored as time domain data samples in an impulse response waveform record. Alternately, the impulse response waveform record of the signal acquisition probe 10 may be generated by taking the derivative of the time domain data samples representing the characterizing step response of the signal acquisition probe.

The time domain data samples of the step response in FIG. 3 and the impulse response in FIG. 4 can be compressed or compacted into a compressed time domain data sample record to reduce the amount of characterizing time domain data samples stored in probe memory 34. One way to compress the time domain data samples is to calculate a slope between the initial data sample voltage of one or the other of the step response or impulse response waveform records and its adjacent data sample voltage to determine a rate of change between the two data sample points. If the slope between the two data sample voltages is less than a threshold slope value, then the initial data sample voltage is saved as part of the compressed time domain data sample record and the adjacent data sample voltage is not. The saved data sample voltages are shown by the circles around the dots in the step response of FIG. 3 and the circles around the X's in the impulse response of FIG. 4. The slope between the initial data sample voltage and the next data sample voltage of the step response or impulse response waveform record is calculated and compared against the threshold slope value. If the slope between the two data sample voltages is less then the threshold slope value, then this next data sample voltage is not saved. The process of calculating the slope between the initial data sample voltage and the data sample voltages in the step response or impulse response waveform records and comparing the slopes to the threshold slope value continues until one of the calculated slopes exceeds the threshold slope value. The data sample voltage used with the initial data sample voltage to generate the slope exceeding the threshold slope value is saved as part of the compressed time domain data sample record. This saved data sample voltage then becomes the initial data sample voltage and is used with the next data sample voltage for calculating the slope between the two voltage samples.

If the calculated slope between the new initial data sample voltage and the next adjacent data sample voltage is greater than the threshold slope value, then the adjacent data sample voltage is saved as part of the compressed time domain data sample record. The adjacent data sample voltage becomes the new initial data sample voltage and the slope between the new initial data sample voltage and the next data sample voltage is calculated. If the slope between the two data sample voltages is greater than the threshold slope value, then the adjacent data sample voltage is saved as part of the compressed time domain data sample record. The process of calculating the slope between initial data sample voltages and other data sample voltages in the step response or impulse response waveform records, comparing the slopes to the threshold slope value and saving the data sample voltages from the slopes exceeding the threshold slope value as part of the compressed time domain data sample record continues until the ends of the step response or impulse response waveform records. The resulting compressed time domain data sample record of the step or impulse response waveform record is stored in the memory 34 of the signal acquisition probe 10.

Figure 5:
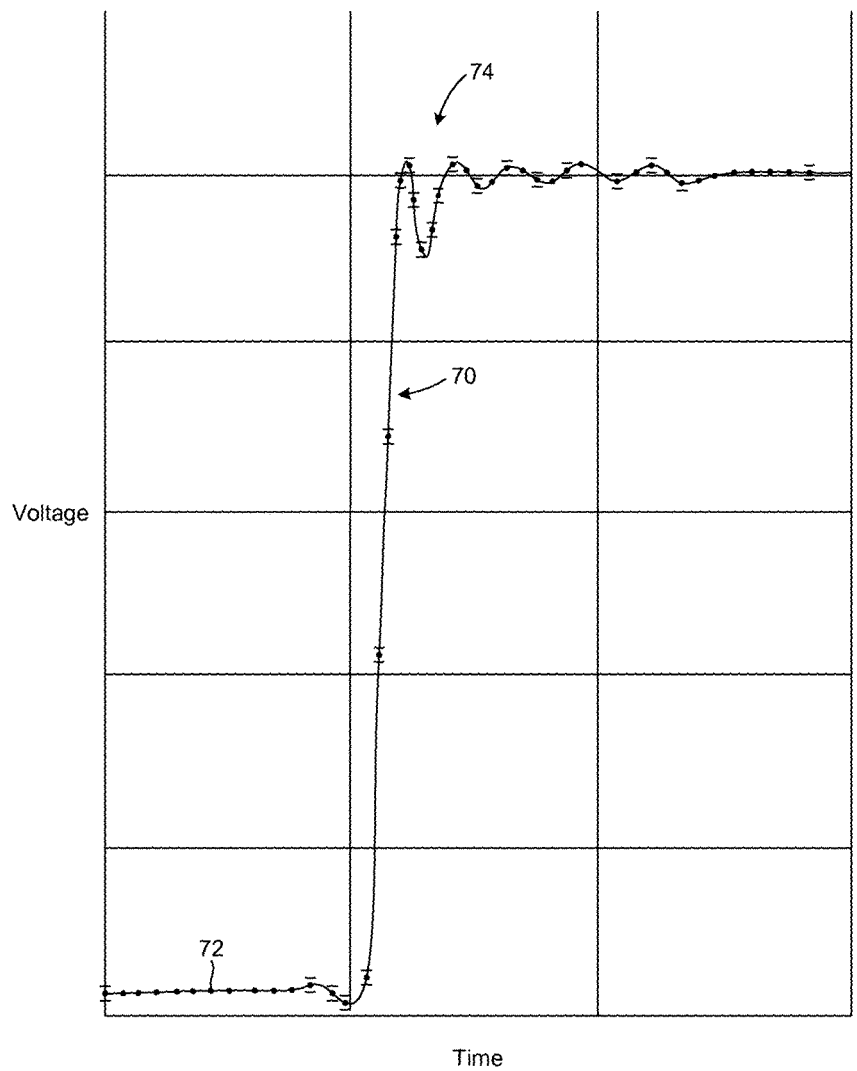
FIG. 5 is a graphical representation of a step response characterizing a signal acquisition probe for illustrating the use of a maximum and minimum threshold value range around voltage samples for compressing time domain voltage samples in a time domain step response waveform record.
Figure 6:
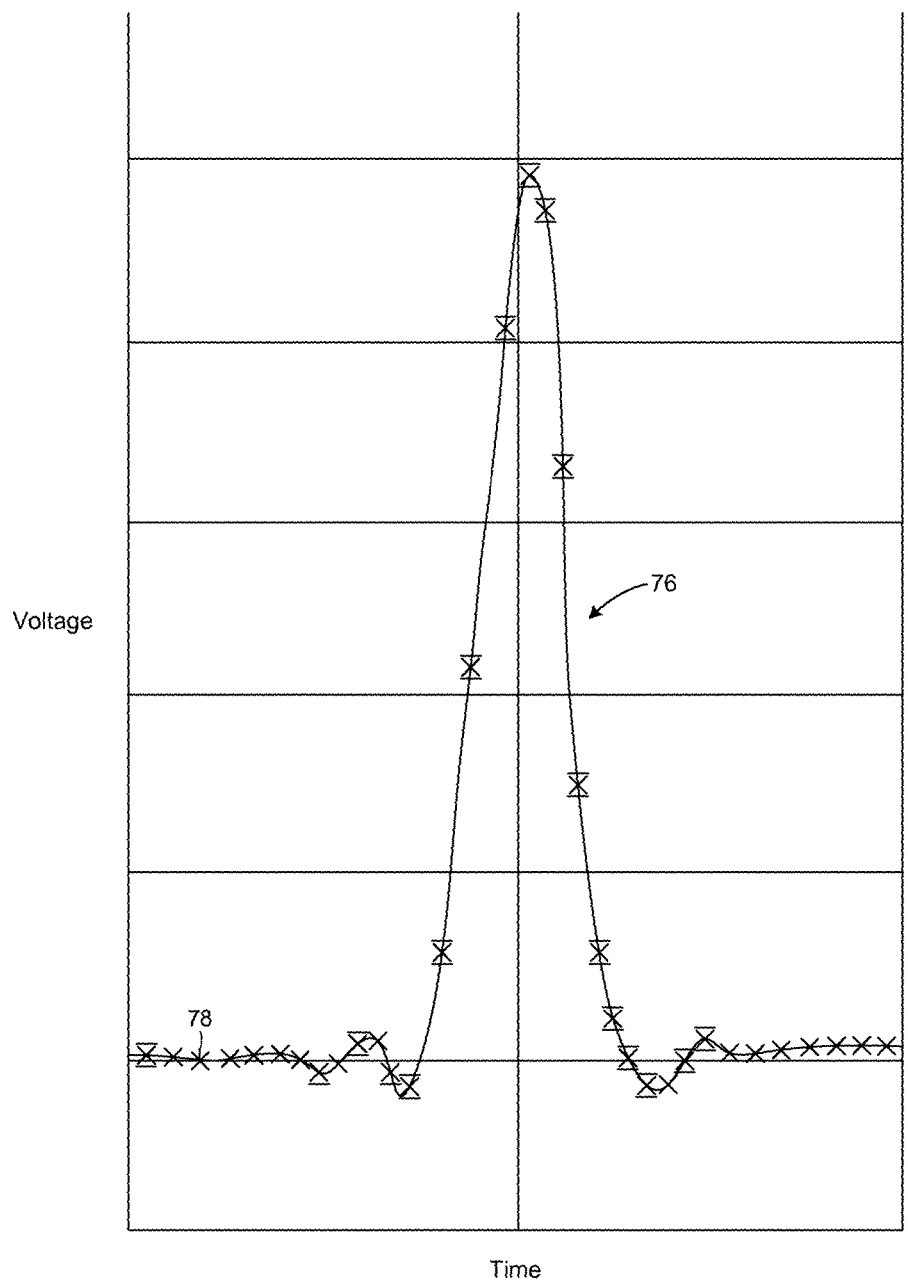
FIG. 6 is a graphical representation of an impulse response characterizing a signal acquisition probe for illustrating the use of a maximum and minimum threshold value range around voltage samples for compressing time domain voltage samples in a time domain impulse response waveform record.

FIGS. 5 and 6 are respective graphical representations of a step response and an impulse response characterizing a signal acquisition probe 10 illustrating an alternative embodiment for compressing or compacting the time domain data samples to reduce the amount of characterizing time domain data samples stored in probe memory 34. A maximum and minimum threshold value range is defined and positioned over the data sample voltages of the respective step and impulse response waveform records. Preferably, the maximum and minimum threshold range is centered on the data sample voltage but may be offset above or below the midpoint of the range. The adjacent data sample voltage in the step response or impulse response waveform record is compared to the maximum and minimum threshold range centered on the initial data sample voltage. If the adjacent data sample voltage is within the maximum and minimum threshold range, then the initial data sample voltage is saved as part of the compressed time domain data and the adjacent data sample voltage is not as shown by the max-min lines above and below the dots and X's in FIGS. 5 and 6. The next data sample voltage in the step response or impulse response waveform records is compared to the maximum and minimum threshold range centered on the initial data sample voltage. If the next data sample voltage is within the maximum and minimum threshold range centered on the initial data sample voltage, then the next data sample voltage is not saved. The process of comparing the maximum and minimum threshold range centered on the initial data sample voltage to the data sample voltages in the step response or impulse response waveform records continues until one of the data sample voltages exceeds maximum and minimum threshold range centered on the initial data sample voltage. The data sample voltage exceeding the maximum and minimum threshold range centered on the initial data sample voltage is saved as part of the compressed time domain data sample record. The maximum and minimum threshold range is centered on the saved data sample voltage which becomes the initial data sample voltage and is used to compare with the next data sample voltage for determining if the next data sample voltage exceeds the maximum and minimum threshold range centered on the new data sample voltage.

If the next adjacent data sample voltage exceeds the maximum and minimum threshold range centered on the new initial data sample voltage, then the adjacent data sample voltage is saved as part of the compressed time domain data sample record. The adjacent data sample voltage becomes the new initial data sample voltage with the maximum and minimum threshold range centered on this new initial data sample voltage. The next adjacent data sample voltage is compared to the maximum and minimum threshold range centered on this new initial data sample voltage. If the next adjacent data sample voltage is greater than the maximum and minimum threshold range centered on this new initial data sample voltage, then the adjacent data sample voltage is saved as part of the compressed time domain data sample record. The process of comparing maximum and minimum threshold range centered on new initial data sample voltages to subsequent data sample voltages in the step response or impulse response waveform records and saving data sample voltages exceeding the new initial data sample voltages continues until the ends of the step response or impulse response waveform records. The resulting compressed time domain data sample record of the step or impulse is stored in the memory 34 of the signal acquisition probe 10.

Figure 7:
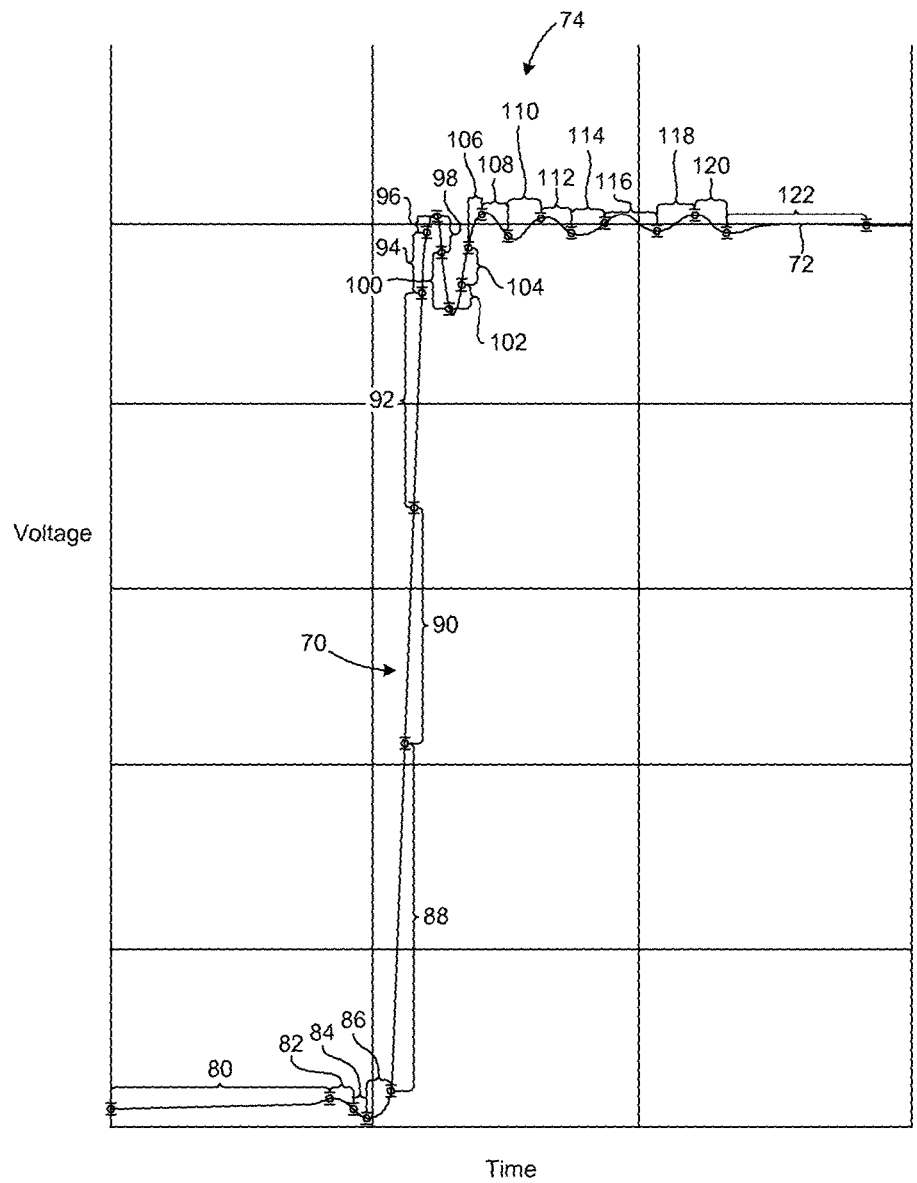
FIG. 7 is a graphical representation of a step response characterizing a signal acquisition probe for illustrating the use of a maximum and minimum threshold value range around voltage samples for filtering and compressing time domain voltage samples in a time domain step response waveform record.
Figure 8:
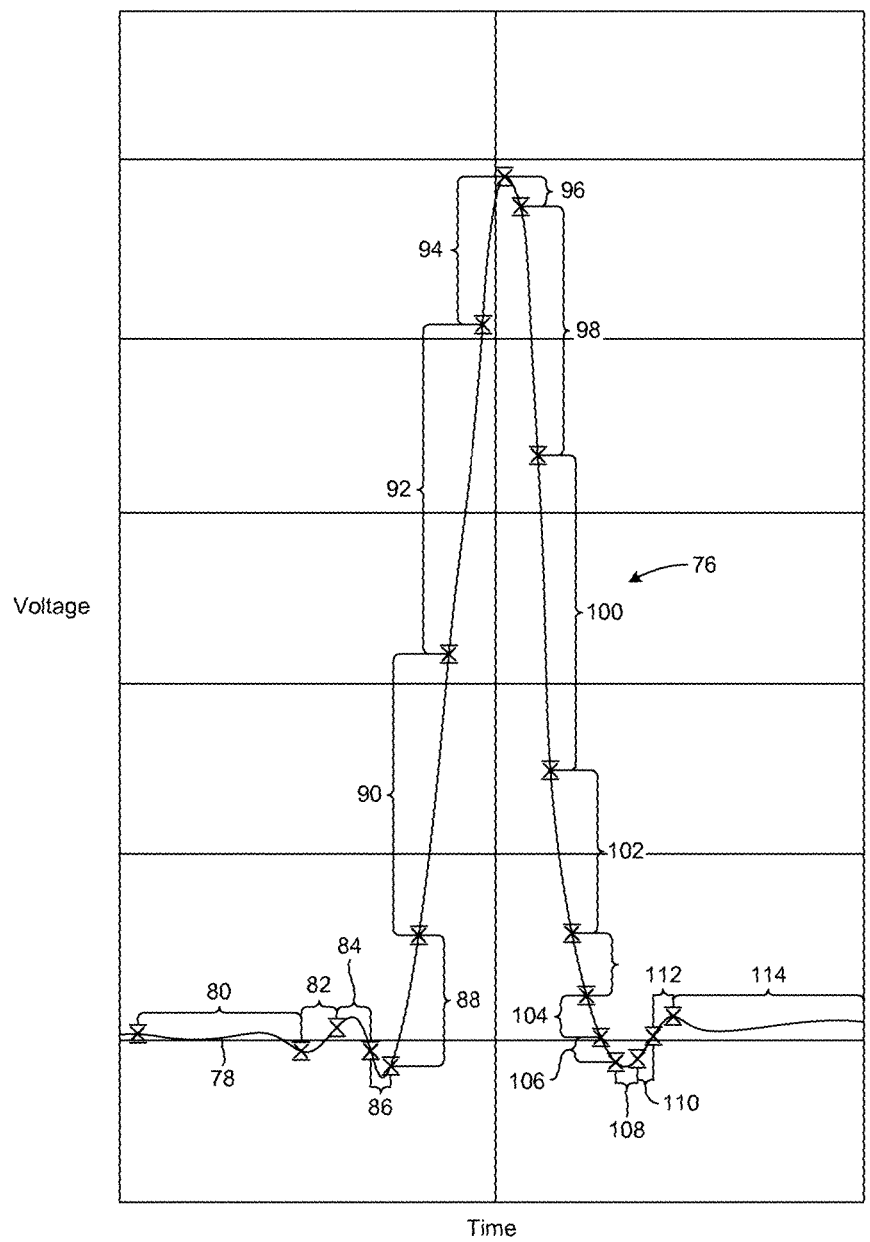
FIG. 8 is a graphical representation of an impulse response characterizing a signal acquisition probe for illustrating the use of a maximum and minimum threshold value range around voltage samples for filtering and compressing time domain voltage samples in a time domain impulse response waveform record.

The time domain data sample records of the step response or the impulse response may be filtered to reduce noise associated with the acquisition of the time domain data samples. Referring to FIGS. 7 and 8 illustrating respective graphical representations of a step response and an impulse response characterizing a signal acquisition probe 10, an adaptive boxcar filter is applied to the respective step response and impulse response using the maximum and minimum threshold range centered on data sample voltages. Data sample voltages in the respective step response waveform record or the impulse response waveform record are compared to the maximum and minimum threshold range centered on the initial data sample voltage in the waveform record. When a subsequent data sample voltage exceeds the maximum and minimum threshold range of the initial data sample voltage, the adaptive boxcar filter averages the magnitudes of the data sample voltages by the number of data samples between the initial data sample voltage and the subsequent data sample voltage exceeding the maximum and minimum threshold range of the initial data sample voltage as shown by region labeled 80. The time interval of the adaptive boxcar filter between the initial data sample voltage and the subsequent data sample voltage exceeding the maximum and minimum threshold range of the initial data sample voltage is divided in half and the averaged data sample voltage magnitude value is preferably assigned this time value. Interpolation between data samples may be used to accurately position the averaged data sample voltage at the proper time location in the region 80. The averaged data sample voltage magnitude at the calculated time is stored as part of the compressed and filtered time domain data sample record. The subsequent data sample voltage exceeding the maximum and minimum threshold range becomes the new initial data sample voltage and subsequent data sample voltages of the step response or impulse response waveform record are compared to the maximum and minimum threshold range centered on the new initial data sample voltage. Subsequent data sample voltages in the waveform record are compared to the maximum and minimum threshold range centered on the new initial data sample voltage to determine the next data sample voltage that exceeds the maximum and minimum threshold range. The adaptive boxcar filter averages the magnitudes of the data sample voltages by the number of data samples between the new initial data sample voltage and the subsequent data sample voltage exceeding the maximum and minimum threshold range of the new initial data sample voltage as shown by region labeled 82. The time interval of the adaptive boxcar filter between the new initial data sample voltage and the subsequent data sample voltage exceeding the maximum and minimum threshold range of the new initial data sample voltage is divided in half and the averaged data sample voltage magnitude is preferably assigned this time value. The new averaged data sample voltage magnitude at the new calculated time is stored as part of the compressed and filtered time domain data sample record. The adaptive boxcar filter continues through the step response or impulse response waveform records determining filter regions (e.g. 84, 86, 88, . . . 122), averaging the data sample voltages within the regions, determining time values, and storing the averaged data sample voltage magnitudes as part of the compressed and filtered time domain data sample record, The above adaptive boxcar filtering process has been described with respect to a maximum and minimum threshold range around data sample voltages. The same adaptive boxcar filter may equally be implemented using a rate of change threshold value as previously described for compressing the step response and impulse response waveform records. A threshold slope value is set and the slope is calculated between the initial data sample voltage of the step response waveform record or impulse response waveform record and subsequent data sample voltages in the record to determine the rate of change between the two data samples. When the slope between the two data sample voltages exceeds the threshold slope value, the adaptive boxcar filter averages the magnitudes of the data sample voltages by the number of data samples between the initial data sample voltage and the subsequent data sample voltage. The time interval of the adaptive boxcar filter between the initial data sample voltage and the subsequent data sample voltage is divided in half and the averaged data sample voltage magnitude is preferably assigned this time value. Interpolation between data samples may be used to accurately position the averaged data sample voltage at the proper time location. The averaged data sample voltage magnitude at the calculated time is stored as part of the compressed and filtered time domain data sample record. The adaptive boxcar filter continues through the step response or impulse response waveform records determining the regions where the slope between data sample voltages that exceed the threshold slope value, averaging the data sample voltages within the regions, determining time values, and storing the averaged data sample magnitude voltages as part of the compressed and filtered time domain data sample record.

The present invention has been described where the step response and impulse response data samples are acquired in the time domain using a sampling oscilloscope. Alternately, the impulse response and the step response may be generated from a frequency response of the signal acquisition probe 10. The signal acquisition probe 10 is coupled to frequency verification system, such as a vector network analyzer, and the frequency response of the signal acquisition probe 10 is characterized. The vector network analyzer provides a series of signals at various frequencies to the signal acquisition probe 10 and the S-Parameter responses of the signal acquisition probe 10 at the various frequencies are captured. The S-Parameters represent scattering ratios of a multi-port network, such as a four-port network, with $S_{11}$ and $S_{22}$ representing reflection coefficients and $S_{21}$ and $S_{12}$ representing transmission coefficients. The S-parameters of the signal acquisition probe 10 characterizes the frequency response of the probe 10 in the spectral domain and may be stored as a Touchstone file. The S-parameters may be converted to T-parameters, ABCD parameters and the like. An Inverse Fast Fourier Transform or the like may be applied to each of the $S_{21}$ and $S_{12}$ transmission coefficients and $S_{11}$ and $S_{22}$ reflection coefficients of the S-Parameters to generate sets of impulse responses representing the $S_{21}$ and $S_{12}$ transmission coefficients and the $S_{11}$ and $S_{22}$ reflection coefficients. The $S_{21}$ transmission coefficients are converted to forward through impulse response waveform record. The $S_{12}$ transmission coefficients are converted to reverse through impulse response waveform record. The $S_{11}$ reflection coefficients are converted to input reflection voltage impulse response waveform record and the $S_{22}$ reflection coefficients are converted to output reflection voltage impulse response waveform record. One or all of the various impulse response waveform records may be stored in the probe memory 34. Integrating the various impulse response waveform records generate corresponding step response waveform record with one or all of the step response waveform records being stored in the probe memory 34. Interpolation may be used on the voltage samples of both the impulse response waveform records and the step response waveform records to produce voltage samples at any desired time steps.

Figure 9A:
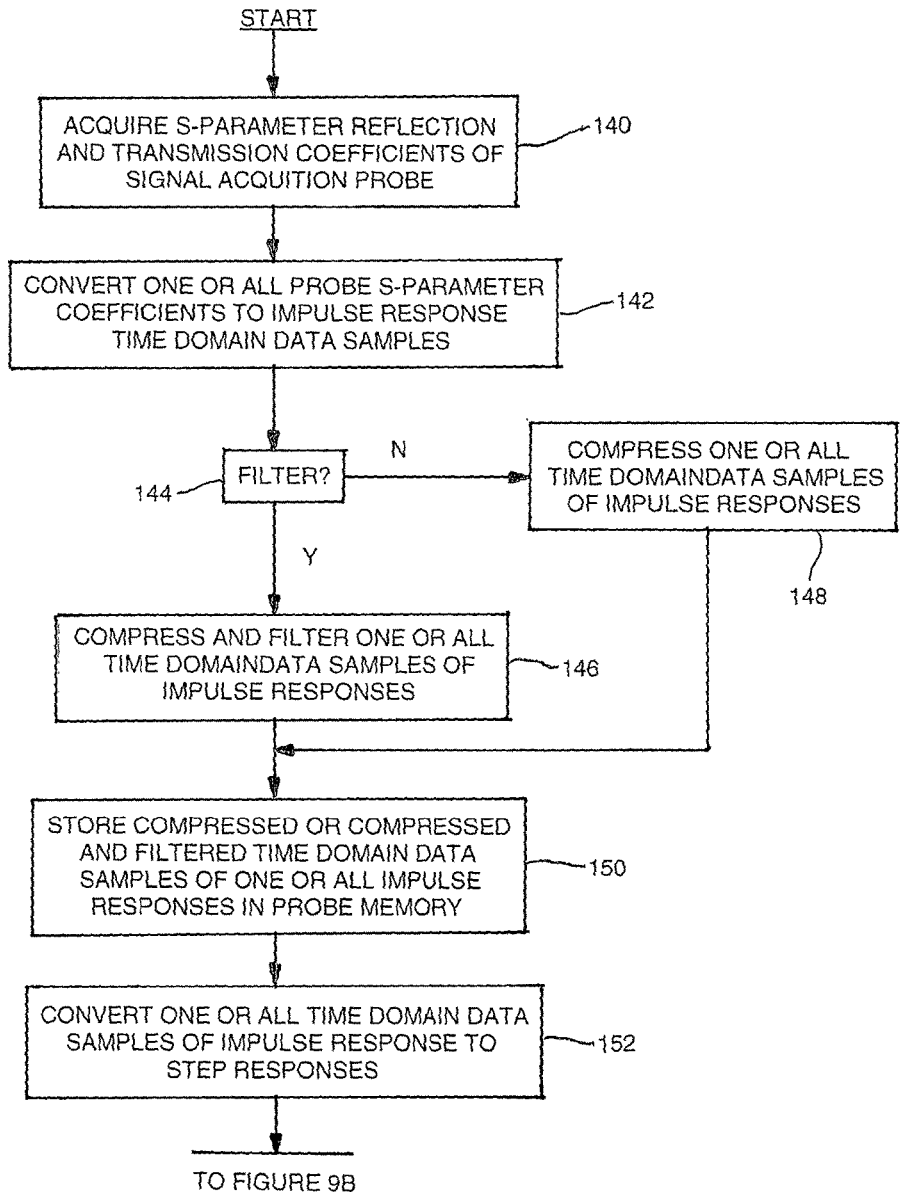
FIGS. 9A-9B is a flow chart describing the steps in converting S-parameter data into impulse response waveform records and step response wave form records in signal measurement system having a signal acquisition probe storing compressed or compressed and filtered time domain impulse or step response data samples according to the present invention.
Figure 9B:
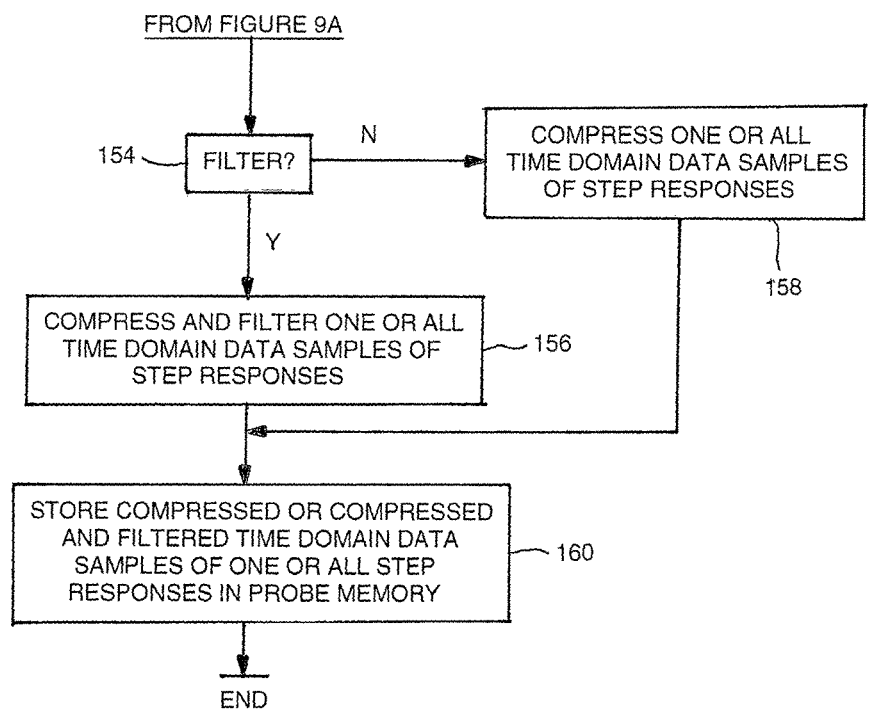

The flow chart of FIGS. 9A-9B shows the steps in converting S-parameter data into time domain impulse response waveform records and time domain step response waveform records. The signal acquisition probe 10 is connected to the vector network analyzer and at least one of the S-parameter reflection and transmission coefficients are acquired for characterizing the spectral response of the signal acquisition probe as shown at step 140. Generally, the vector network analyzer acquired the S-parameters for all of the transmission coefficients and all of the reflection coefficients. At least one of the S-parameter transmission coefficients or reflection coefficients are converted to time domain data samples representing the impulse response using an Inverse Fast Fourier Transform or the like at step 142. The time domain data samples of the impulse response may be compressed or compressed and filtered as represented by decision step 144. The time domain data samples of the impulse response are filtered and compressed as a function of the rate of change of the impulse response or as a function of the maximum and minimum threshold value range applied to the time domain data samples at step 146. The time domain data samples of the impulse response are compressed as a function of the rate of change of the impulse response or as a function of the maximum and minimum threshold value range applied to the time domain data samples at step 148. The compressed time domain data samples of the impulse response or the compressed and filtered time domain data samples of the impulse response are stored in the probe memory 34 at step 150.

The time domain data samples of one or all of the impulse responses may be converted to time domain data samples representing the step responses by integrating time domain data samples representing the impulse responses at step 152. The time domain data samples of the step response or responses may be compressed or compressed and filtered as represented by decision step 154. The time domain data samples of the step response or responses are compressed and filtered as a function of the rate of change of the step response or as a function of the maximum and minimum threshold value range applied to the time domain data samples at step 156. The time domain data samples of the step response or responses are compressed as a function of the rate of change of the step responses or as a function of the maximum and minimum threshold value range applied to the time domain data samples at step 158. The compressed or compressed and filtered time domain data samples of the step response or responses are stored in the probe memory 34 at step 160.

Figure 10:
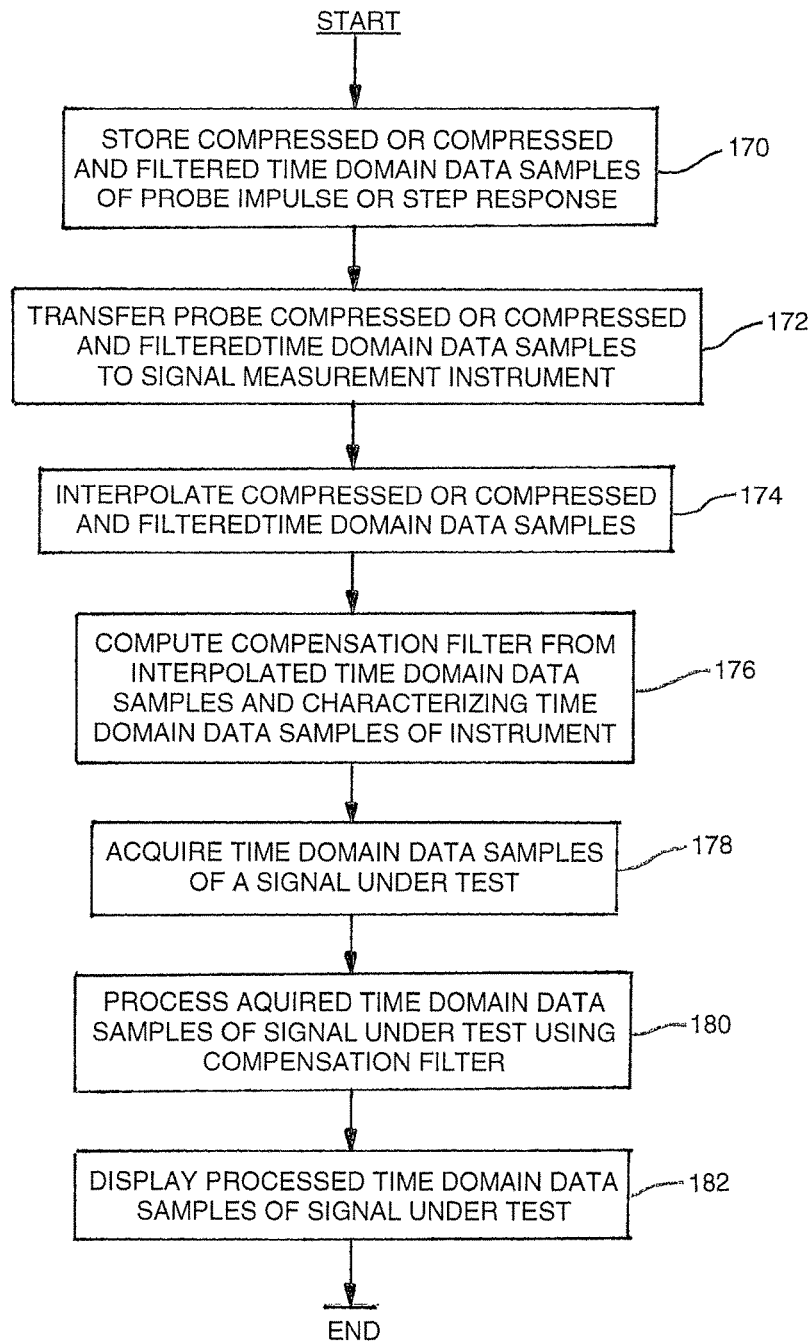
FIG. 10 is a flow chart describing the steps in compensating a signal channel of a signal measurement instrument connected to a signal acquisition probe storing compressed or compressed and filtered time domain impulse or step response data samples according to the present.

The compressed time domain data samples or the compressed and filtered time domain data samples of the step response or the impulse response stored in memory 34 of the signal acquisition probe 10 may be used for compensating a signal channel 28 of the signal measurement instrument 12. FIG. 10 is a flow chart describing the steps in compensating a signal channel 28 in the signal measurement instrument 12 using the compressed time domain data samples or the compressed and filtered time domain data samples of the step response or the impulse response characterizing the signal channel 28 of the signal measurement instrument 12. The compressed time domain data samples or the compressed and filtered time domain data samples of at least one of the step response or the impulse response is stored in memory 34 of the signal acquisition probe 10 as shown in step 170. The signal acquisition probe 10 is connected to one of the interconnect receptacles 24 of the signal measurement instrument 12. The controller 48 in the signal measurement instrument 12 senses the connection of the signal acquisition probe 10 and sends a command to the probe controller 32 requesting the contents of the probe memory 34 to be provided to the signal measurement instrument 12. The compressed time domain data samples or compressed and filtered time domain data samples of at least one of the step response or impulse response stored in memory 34 is transferred to the signal measurement instrument 12 at step 172. The compressed time domain data samples or the compressed and filtered time domain data samples are interpolated at step 174 to provide sufficient data samples for use by the controller 48 in computing a compensation filter. The controller 48 computes a compensation filter from the compressed time domain data samples or the compressed and filtered time domain data samples of the step response or the impulse response and the time domain data samples characterizing the signal channel 28 of the signal measurement instrument 12 at step 176. The compensation filter may take the form of an Infinite Finite Response (FIR) filter having multiple filter taps that compensates for at least one of the impulse response or step response of the signal acquisition probe 10.

Once the signal channel 28 of the signal measurement instrument 12 has been calibrated, the signal acquisition probe 10 may be connected to a device under test to acquire a signal under test. The signal acquisition system 56 of the signal channel 28 acquires time domain data samples of the signal under test at step 178. The time domain data samples generated by the acquisition system 56 are processed using the computed compensation filter at step 180. The processed time domain data samples using the compensation filter may be displayed on the display device 58 of the signal measurement instrument 182.

Figure 11A:
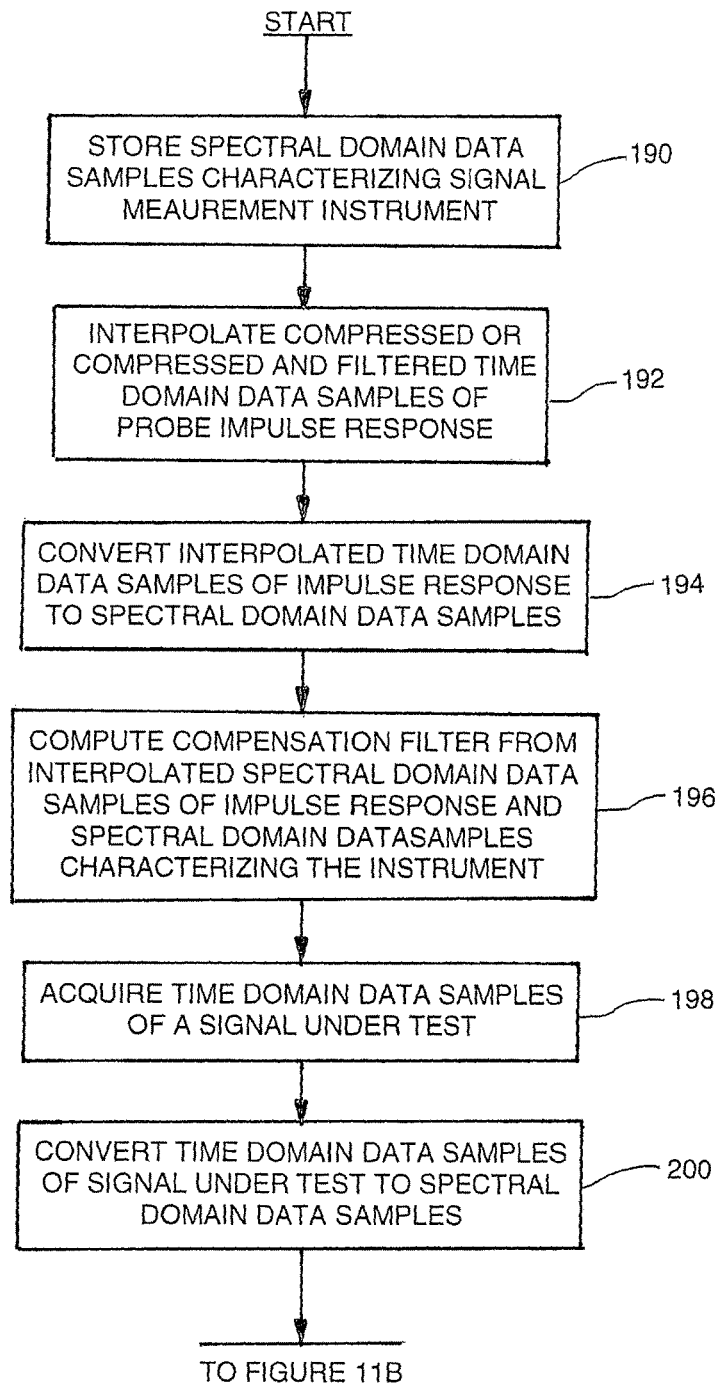
FIGS. 11A-11B are a flow chart describing alternate steps in compensating a signal channel of a signal measurement instrument connected to a signal acquisition probe storing compressed or compressed and filtered time domain impulse or step response data samples according to the present.
Figure 11B:
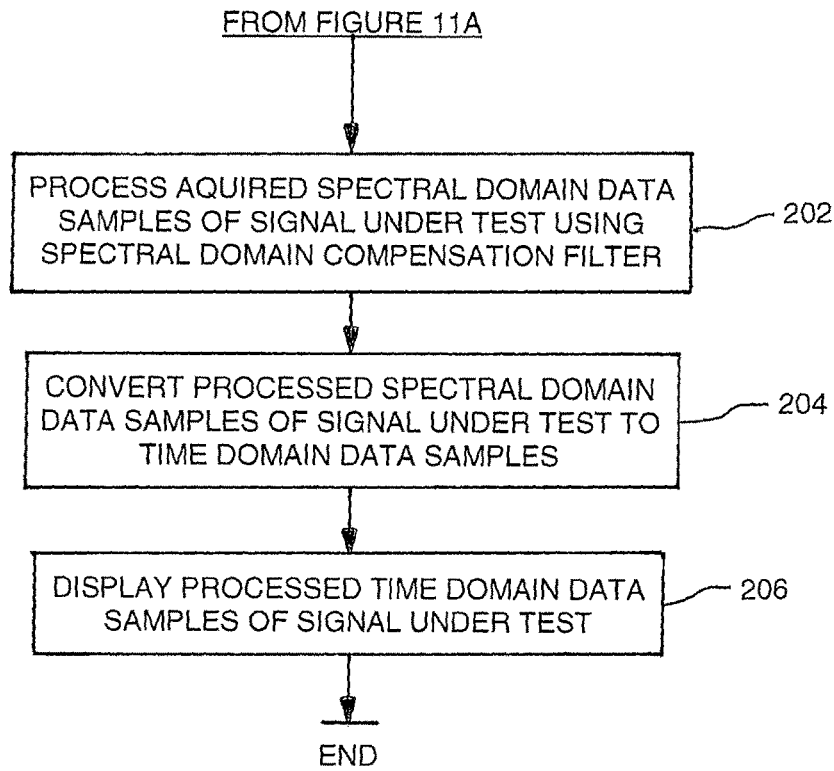

The flow chart of FIGS. 11A-11B shows an alternate method of compensating the signal channel 28 of the signal measurement instrument 12. The time domain data samples characterizing the signal channel 28 of the signal measurement instrument 12 are stored in the signal measurement instrument 12 as spectral domain data at step 190. The compressed time domain data samples or the compressed and filtered time domain data samples of the step or impulse responses of the signal acquisition probe 10 are loaded into the signal measurement instrument 12 and may be interpolated by the controller 46 in the signal measurement instrument 12 to generate equal time step between samples at step 192 for providing a sufficient number of time domain data samples for conversion to the spectral domain. The interpolated time domain data samples of the impulse response are converted to a spectral domain representation using a Fast Fourier Transform or the like at step 194. The derivative of the time domain data samples of the step response produces an impulse response which may be converted to a spectral response a Fast Fourier Transform or the like. The controller 48 computes a spectral domain compensation filter from the spectral domain data samples of the step response or the impulse response and the spectral domain data samples characterizing the signal channel 28 of the signal measurement instrument at step 196. Once the spectral domain compensation filter is computed for the signal channel 28 of the signal measurement instrument 12, the signal acquisition probe 10 may be connected to a device under test to acquire a signal under test. The signal acquisition system 56 of the signal measurement instrument 12 acquires time domain data samples of the signal under test at step 198. The time domain data samples generated by the acquisition system 56 are converted to the spectral domain at step 200 and processed using the computed spectral domain compensation filter at step 202. The spectral domain data samples of the signal under test processed by the spectral domain compensation filter are converted to compensated time domain data samples at step 204. The processed compensated time domain data samples may be displayed on the display device 58 of the signal measurement instrument at step 206.

The present invention has been described using the rate of change and maximum and minimum range for compressing or compressing and filtering the time domain data samples of a step response or an impulse response. The present invention is not limited to these two examples and other compression and compression and filtering processed may be used. For example, the adaptive boxcar filter may be replaced with a Gaussian weighted average filter or a raised cosine filter. Additionally, a low-pass filter may be applied to the time domain data samples to determine sample points, and then an adaptive filtering algorithm may be applied to filter the original signal based on the sample points determined from the low-pass filter waveform. Further, the sample spacing and window width for filtering could be determined by simply making the width a function of the distance from the midpoint of the rising edge of the step response or the peak of the impulse response. The filter keeps every sample within a certain time of the center of the step response or impulse response waveform record (assuming the edge is centered in the record), then filters everything outside that time.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method of characterizing an electrical response of a signal acquisition probe comprising the steps of:
    applying a calibration signal to the signal acquisition probe;
    acquiring, via a probe tip of the signal acquisition probe, time domain data samples of the calibration signal to characterize a frequency response of the signal acquisition probe;
    generating, via a controller of the signal acquisition probe, a compressed time domain data sample record that characterizes the frequency response of the signal acquisition probe by:
        generating a first averaged time domain data sample value over a first time domain data sample range from an initial time domain data sample to a subsequent time domain data sample of the time domain data samples when a rate of change value exceeds a threshold value, and
        generating a second averaged time domain data sample value over a second time domain data sample range where the subsequent time domain data sample from the first time domain data sample range becomes the initial time domain data sample for the second time domain data sample range; and
    storing, in a memory of the signal acquisition probe, the compressed time domain data sample record to be utilized to compensate a signal under test received from a device under test for the frequency response of the signal acquisition probe.

2. The method of characterizing an electrical response of a signal acquisition probe as recited in claim 1 wherein the calibrating signal comprises a rising edge step signal wherein the acquired time domain data samples characterize a step response of the signal acquisition probe.

3. The method of characterizing an electrical response of a signal acquisition probe as recited in claim 1 wherein the calibrating signal comprises an impulse signal wherein the acquired time domain data samples characterize an impulse response of the signal acquisition probe.

4. A method of characterizing an electrical response of a signal acquisition probe comprising:
    applying a calibration signal to the signal acquisition probe;
    acquiring, via a probe tip of the signal acquisition probe, time domain data samples of the calibration signal to characterize a frequency response of the signal acquisition probe;
    generating, via a controller of the signal acquisition probe, a compressed time domain data sample record that characterizes the frequency response of the signal acquisition probe by:
        generating a first averaged time domain data sample value over a first time domain data sample range defined by an initial time domain data sample and a subsequent time domain data sample exceeding at least one of a maximum threshold value and a minimum threshold value centered on the initial time domain data sample, and
        generating a second averaged time domain data sample value over a second time domain data sample range where the subsequent time domain data sample from the first time domain data sample range becomes the initial time domain data sample for the second time domain data sample range; and
    storing the compressed time domain data sample record to be utilized to compensate a signal under test received from a device under test for the frequency response of the signal acquisition probe.

* * * * *